(12) United States Patent
Kiehl et al.

(10) Patent No.: US 7,042,206 B2
(45) Date of Patent: May 9, 2006

(54) INTEGRATED CIRCUIT AND METHOD FOR OPERATING THE INTEGRATED CIRCUIT

(75) Inventors: Oliver Kiehl, Charlotte, VT (US); Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 744 days.

(21) Appl. No.: 10/245,629

(22) Filed: Sep. 17, 2002

(65) Prior Publication Data

US 2003/0056148 A1  Mar. 20, 2003

(30) Foreign Application Priority Data

Sep. 17, 2001 (DE) ................ 101 45 745

(51) Int. Cl.
*G01R 23/175* (2006.01)
*H04L 1/22* (2006.01)

(52) U.S. Cl. ..................... 324/76.54; 714/25

(58) Field of Classification Search ............. None
See application file for complete search history.

(56) References Cited

U.S. PATENT DOCUMENTS 6,052,810 A * 4/2000 Creek ................. 714/740
6,205,086 B1   3/2001 Hanzawa et al.
6,260,154 B1   7/2001 Jeddeloh

* cited by examiner

*Primary Examiner*—Vincent Q. Nguyen
(74) *Attorney, Agent, or Firm*—Laurence A. Greenberg; Werner H. Stemer; Ralph E. Locher

(57) ABSTRACT

An integrated circuit has connecting pads for outputting digital signals, a connection for a time reference signal, and an assessment circuit to measure and assess a phase shift between one of the digital signals and the time reference signal. A receiver circuit is connected to a respective junction between one of the connecting pads and an associated output driver. A device for matching propagation times of signals applied to the receiver circuit is provided. The assessment circuit is connected to the receiver circuit and has an output to output a measured result. In each case, the phase shift of the signals to be output in relation to the time reference signal is measured and assessed separately. An offset of the switching edges of the signals to be output can be determined relatively accurately and corrected.

15 Claims, 2 Drawing Sheets

INTEGRATED CIRCUIT AND METHOD FOR OPERATING THE INTEGRATED CIRCUIT

BACKGROUND OF THE INVENTION

Field of the Invention

The present invention relates to an integrated circuit having connecting pads to output digital signals, and a method for its operation.

Integrated circuits such as DRAM memories with double-data-rate architecture (DDR SDRAM memories), as they are known, have comparatively high switching and access speeds. Integrated circuits of this type generally have, in addition to a clock signal which is usually supplied externally, a data reference signal ("data strobe") which, when data are read from the integrated memory, is applied to a connecting pad. During a read access, the data strobe signal is transmitted to the outside by the integrated memory together with data signals which are to be output and which are present on respective further connecting pads, and serves as a reference signal for the data to be read out.

During normal operation of the memory, for example, a controller is connected to the connection for the output of a data signal and to the connection for the output of the data reference signal. The data reference signal indicates to the controller at what time data to be read out are present on a data connection. A timing parameter, as it is known, is specified, which represents the maximum permissible time deviation between the data reference signal generated by the memory and output data.

It is in particular this timing parameter that has to be tested as accurately as possible and in a manner close to the application before the memory is delivered to the customer, in order to keep the failure rate of a memory as low as possible. Such a test is generally performed by an external test system. During test operation, the edges of a data signal and of the corresponding data reference signal are compared with one another. The accuracy that can be achieved is generally limited by tolerances in the test system.

In order to compensate for the test inaccuracy, integrated circuits are, for example, tested with a large safety margin in relation to the specification. It is therefore possible to ensure that each integrated circuit that has passed a test measurement will certainly meet the specification even if the test system supplies a measured result that is at the limit of its accuracy. However, this does not necessarily mean that an integrated circuit that has not successfully carried out a test operation would not meet the corresponding specification. The result of this is that integrated circuits that are intrinsically capable of functioning have to be discarded because of a failed test as a result of tester inaccuracy.

SUMMARY OF THE INVENTION

It is accordingly an object of the invention to provide an integrated circuit and a method for operating the integrated circuit which overcomes the above-mentioned disadvantages of the prior art devices and methods of this general type, in which a time offset between edges of a plurality of signals to be output from the integrated circuit can be determined with high accuracy.

With the foregoing and other objects in view there is provided, in accordance with the invention, an integrated circuit. The integrated circuit contains a first output driver, a first connecting pad connected to the first output driver and outputting a first digital signal, a second output driver, a second connecting pad connected to the second output driver and outputting a second digital signal, a connection for a time reference signal, and a receiver circuit having a first input connected to a junction between the first connecting pad and the first output driver, a second input connected to a junction between the second connecting pad and the second output driver, and an output. A device for assisting in matching propagation times of signals present on the first and second inputs of the receiver circuit, is provided. The device is connected between at least one of the first and second inputs and at least one of the first and second output drivers. An assessment circuit for measuring and assessing a phase shift between an applied signal and the time reference signal, is provided. The assessment circuit has a first input connected to the output of the receiver circuit, a second input connected to the connection for the time reference signal, and an output for outputting a measured result.

The invention may be used for many different circuits. According to the present invention, the time reference signal is used as a time reference for the digital signals to be matched. In the case in which the integrated circuit is a memory circuit of the DDR SDRAN type, the signals to be matched are one or more data signals and the corresponding data reference signal or data strobe. Accordingly, in this case the first connecting pad is used to output the data signal and the second connecting pad is used to output a data reference signal.

The receiver circuit has a first input, which is connected to a junction between the first connecting pad and the first output driver for driving the first digital signal, and also a second input, which is connected to a junction between the second connecting pad and the second output driver for driving the second digital signal. A first input of the assessment circuit is connected to the output of the receiver circuit, a second input of the assessment circuit is connected to the connection for the time reference signal. An output of the assessment circuit is used to output a measured result. The assessment circuit is used to measure and assess phase shifts between a signal present on the output of the receiver circuit and the time reference signal. In addition, a device for matching the propagation times of signals present on the first and second inputs of the receiver circuit is provided.

In one embodiment, the signals to be matched are carried from the corresponding connecting pad to the receiver circuit via propagation-time-matched lines that, for example, have a meandering form. These lines, coordinated in terms of signal propagation time, have to be produced very exactly and independently of process fluctuations. By providing a common receiver circuit, it is ensured that the influence of the receiver circuit is identical for all the signals to be matched. Since the influence of the receiver circuit is identical for the first and second digital signal, it does not need to be taken into account any further for the measurement of the time offset between the signals.

In one embodiment of the invention, the first and second inputs of the receiver circuit are connected to a multiplexer circuit, by which the inputs are enabled alternatively to one another. By tapping off the digital signals between the output driver and connecting pad, it is ensured that the signals are tested in the form in which they are present, for example, on an external controller. The assessment circuit used can be any desired circuit that is suitable for measuring phase shifts by using a time reference signal. During operation of the integrated circuit, for example during test operation of an integrated memory which is contained in it, the first signal and the second signal are in each case measured separately with regard to their rising and falling edges, and the respective phase shift of the rising and falling edges is assessed in relation to the time reference signal. An adjustment of the time for the rising and/or falling edges of the signals is then carried out in such a way that the rising and falling edges of a respective signal exhibits substantially no phase shift.

In one embodiment, the integrated circuit has a programmable control circuit for this purpose. The control circuit has an output to output a control signal for controlling a time of the first and/or second signal. The control circuit has, for example, a control input that is connected to the output of the assessment circuit for receiving the measured result. This makes it possible for the integrated circuit to perform the appropriate adjustments automatically.

The corresponding signal is advantageously adjusted by adjusting an adjustable driver strength of the respective output driver. For example, the output drivers have a number of transistor paths (fingers) which, depending on the control signal from the control circuit, can be connected or disconnected individually.

In the further course of the test operation, the time of the rising and falling edges that are matched to one another can be compared with a target value. The target value is determined by using the specification and can be used as a pass/fail limit, as it is known. By using a comparison between the measured result and the target value, a pass/fail decision can be made and can be provided to the outside via an external connection.

Coordinating the times of the edges to the target value is carried out, for example, by controlling the enable signal of the respective output driver. For this purpose, in one embodiment the activation time of the output drivers is controlled by a delay circuit. The delay circuit advantageously is controlled by the control circuit.

Adjusting the control signal of the control circuit can be carried out, for example, via laser fuses or via the internal chip programming of electric fuses that are contained in the control circuit.

In accordance with an added feature of the invention, a delay circuit is connected to at least one of the first and second output drivers and to the output of the programmable control circuit. At least one of the first and second output drivers has an activation time controlled by the delay circuit and the control signal output from the programmable control circuit.

With the foregoing and other objects in view there is provided, in accordance with the invention, a method of operating an integrated circuit. The integrated circuit has a first output driver, a first connecting pad connected to the first output driver and outputting a first digital signal, a second output driver, a second connecting pad connected to the second output driver and outputting a second digital signal, a connection for a time reference signal, a receiver circuit having a first input, a second input, and an output, a device for assisting in matching propagation times of signals present on the first and second inputs of the receiver circuit, and an assessment circuit for measuring and assessing a phase shift between an applied signal and the time reference signal. The method includes the steps of outputting the first digital signal and the second digital signal each having a rising edge and a falling edge during a reading process, measuring and assessing the phase shift-of the-rising edge and the falling edge in relation to the time reference signal for the first and second digital signals separately, and carrying out an adjustment of at least one of the rising edge and the falling edge of at least one of the first and second digital signals such that the rising edge and the falling edge of the first and second digital signals substantially exhibit no phase shift in relation to each other.

In accordance with an added mode of the invention, there is the step of carrying out an adjustment by adjusting an adjustable driver strength of at least one of the first and second output drivers.

In accordance with another mode of the invention, there is the step of making a comparison between a timing of a target value and the rising and falling edges of the first and second digital signals. The timing of the rising and falling edges to the target value is adjusted by controlling an enable time of at least one of the first and second output drivers.

In accordance with a concomitant mode of the invention, during a start or normal operation of the integrated circuit, there is the step of reading out the first and second digital signals and coordinating times of the rising and falling edges with each other.

Other features which are considered as characteristic for the invention are set forth in the appended claims.

Although the invention is illustrated and described herein as embodied in an integrated circuit and a method for operating the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
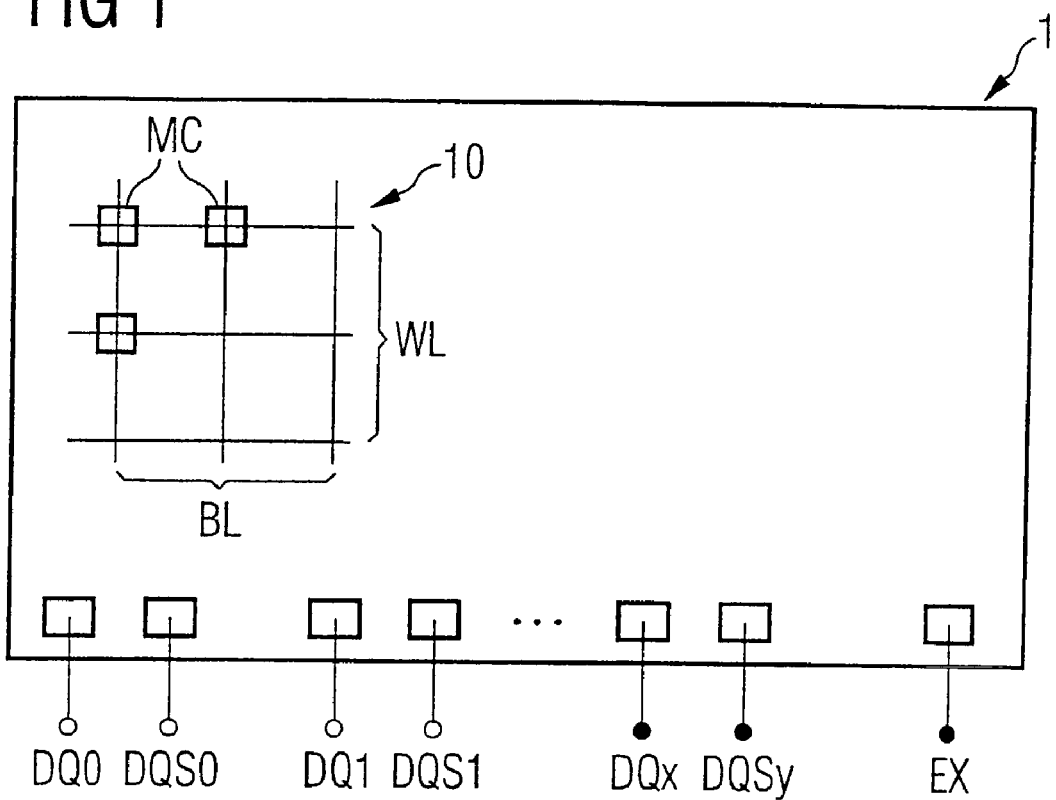
FIG. 1 is a block diagram of an embodiment of an integrated circuit in the form of an integrated memory with connecting pads for data signals and data reference signals according to the invention.

Referring now to the figures of the drawing in detail and first, particularly, to FIG. 1 thereof, there is shown an embodiment of an integrated circuit in the form of a DDR DRAM 1. The memory 1 contains a memory cell array 10 having word lines WL and bit lines BL, at whose intersections memory cells MC are disposed. The memory cells MC are wired to the word lines WL and the bit lines BL in the usual DRAM-specific way. The memory 1 has connecting pads to output digital data signals DQ0 to DQx and connecting pads to output digital data reference signals DQS0 to DQSy. The signals DQS0 to DQSy are also referred to as data strobe signals. They are used as reference signals, for example for a connected controller, which in particular indicate the validity of the data signals to be output. In a test operation, the time discrepancy between the generated data signals DQ0 to DQx and the respective data reference signals DQS0 to DQSy are to be determined.

Figure 2:
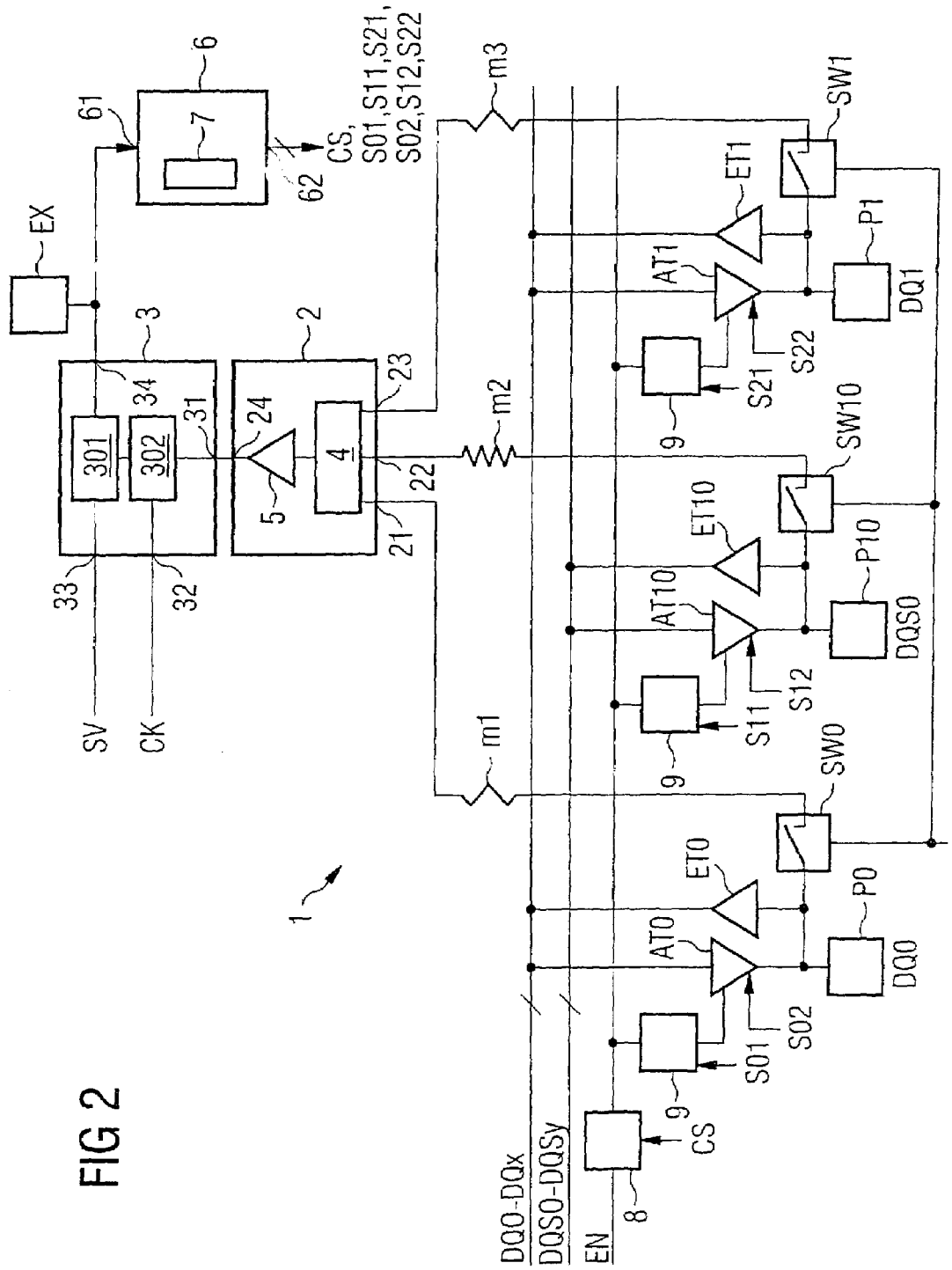
FIG. 2 is a block diagram of an embodiment of an integrated circuit according to the invention.

FIG. 2 shows, as an extract, an embodiment of an integrated circuit according to the invention, which, for example, is contained in the memory 1 according to FIG. 1. One connecting pad P0 is connected to an output driver AT0 and is used to output the data signal DQ0. One connecting pad P10 is connected to an output driver AT10 and is used to output the data reference signal DQS0. In an analogous way to the connecting pad P0, the connecting pad P1 is connected to an output driver AT1 and is used to output a further data signal DQ1. For clarity, further pads are not illustrated. The output drivers AT0 and AT1 are in each case connected to one of the data lines of an internal data bus for the data signals DQ0 to DQx. The output driver AT10 is connected to one of the internal lines for the data reference signals DQS0 to DQSy. The connecting pads P0, P1 and P10 are also used to input corresponding signals, here via the respective input drivers ET0, ET1 and ET10.

A receiver circuit 2 has a plurality of inputs, a first input 21 being connected to a junction between the connecting pad P0 and the output driver AT0 via a switch SW0. A second input 22 is connected to a junction between the connecting pad P10 and the output driver AT10 via a switch SW10, and a third input 23 is connected to a junction between the connecting pad P1 and the output driver AT1 via a switch SW1. To match the propagation times of signals present on the inputs 21 to 23 of the receiver circuit 2, meandering lines m1 to m3 constructed differently here are provided, in each case being connected to one of the inputs 21–23. The lines m1 to m3 have to be produced very exactly and independently of process fluctuations. Other forms of matching propagation times, such as delay circuits of various types, are also conceivable. The switches SW0 to SW10 can be open in normal operation, in-order to decouple the load from the lines m1 to m3.

The inputs 21 to 23 of the receiver circuit 2 are also connected to a multiplexer circuit 4, by which the inputs can be enabled alternatively to one another. One output of the multiplexer circuit 4 is connected to a receiver 5. One input 31 of an assessment circuit 3 is connected to an output 24 of the receiver circuit 2. A further input 32 of the assessment circuit 3 is connected to a connection for a time reference signal CK, for example in the form of an external clock signal. The inputs 31 and 32 are connected by a comparator circuit 302, which is used to measure phase shifts between a signal present on the input 31 and the time reference signal CK. The circuit 302 supplies a value that can be stored in a further circuit 301. In the circuit 301, this value is additionally compared with a target value SV on an input 33, and a corresponding measured result is output at the output 34 of the assessment circuit 3.

Evaluation of the measured result can be carried out in various ways. First, measured values can be output via a connecting pad EX, for example in the form of a pass/fail result. It is then possible to decide whether the tested integrated circuit will be discarded or continue to be used. In another case, it is possible to make the necessary adaptations via externally programmable laser fuses. In a further embodiment, as illustrated in FIG. 2, a programmable control circuit 6 is provided which has a control input 61 that is connected to the output 34 of the assessment circuit 3 for the output of a measured result. The control circuit 6 has an output 62 to output control signals CS and S01 to S22, with which times of edges of a plurality of signals can be controlled.

The driver strength of the output drivers AT0, AT1 and AT1O are adjustable. For the purpose of adjustment, use is made here of the control signals S02, S12 and S22, via which, for example, corresponding transistor terminals (fingers) which can be connected and belong to the respective output driver are connected or disconnected. By connecting or disconnecting transistor terminals, the driver strength of the respective output driver can be adjusted.

The output drivers AT0, AT1 and AT10 are also activated via an enable signal EN. In this embodiment of the invention, delay circuits 8 and 9 are provided, via which the activation of a respective output driver can be delayed. Via the delay circuit 8, controlled by the control signal CS of the control circuit 6, all the output drivers AT0, AT1 and AT10 can be delayed globally. Via the delay circuits 9, controlled by the control signals S01, S11 and S21 from the control circuit 6, the activation of the individual output drivers can be delayed individually.

In the following text, a test operation of the memory 1 according to FIG. 1 by the circuit according to FIG. 2 will be explained in more detail.

At the start of the test, the chip is switched into a read mode, as it is known. A first data signal, for example DQ0, is read and at the same time switched to the input 21 of the receiver circuit 2. The data signal DQ0 initially has a rising edge, which is compared with the time reference signal CK with regard to phase shift. The comparison supplies a result that is stored in a circuit 301. The above-described measurement is then carried out in an analogous way for a falling edge of the data signal DQ0. The result is also stored in the circuit 301. If the measured values for the rising and falling edges of the signal DQ0 are shifted in relation to each other, there then follows an adjustment of the time of the rising and/or falling edge of the signal DQ0, in such a way that the rising and falling edges of the signal exhibits substantially no phase shifts in relation to each other. A shift can be compensated for in particular by different connection and disconnection of n-channel and p-channel switching transistors in the variable output drivers AT0, AT1 and AT10.

There then follows a comparison of the time of the matched rising and falling edges with a target value according to the specification. Coordinating the time of the edges with the target value is carried out by controlling the enable time of the respective output driver, either globally via the delay circuit 8 or individually via the individual delay circuits 9.

The measurements described are then carried out one after another for all the signals to be tested. For example, first of all, the data reference signal DQS0 is assessed and adjusted in an analogous way to the data signal DQ0. This permits the timing parameter that specifies the maximum permissible time discrepancy between a data reference signal (DQS0 here) and a data signal that is present (DQ0 here) to be tested comparatively accurately and in a manner close to the application and, if required, corrected.

The measurement can advantageously also be carried out during normal operation of the memory, if the signals with an appropriate 0/1 or 1/0 transition are used for this purpose during the read access. As an alternative to this, during the initialization of the chip, for example during each boot, as it is known, a connected controller could issue a specific number of read commands to the chip, which the chip can use for the comparison.

Since, therefore, at the start or from time to time during normal operation of the circuit, a plurality of signals can be read out and their edges can be coordinated in relation to the time reference signal, it is possible to appropriately readjust an integrated circuit. This is beneficial as the edge alignment may degrade over time. This ensures that the specification is met over long periods of operation of the integrated circuit. Even temperature variations, which may cause a signal offset, can be compensated.

An item of corrective information can be programmed, for example by electrically programmable fuses 7 or an appropriate transistor circuit in the control circuit 6 according to FIG. 2. An immediate new test is then started in order to check the success of the correction. If the time reference signal used is an external clock signal whose frequency can be determined, the absolute value of a discrepancy can be determined. Since the time offset of the signals DQ0 to DQx or DQS0 to DQSy also depends on the load wiring of the individual signals, the influence of the system environment can also be compensated for by the integrated circuit according to the invention. This is generally not possible in a test environment with an external test instrument.

We claim:

1. An integrated circuit, comprising:
    a first output driver;
    a first connecting pad connected to said first output driver and outputting a first digital signal;
    a second output driver;
    a second connecting pad connected to said second output driver and outputting a second digital signal;
    a connection for a time reference signal;
    a receiver circuit having a first input connected to a junction between said first connecting pad and said first output driver, a second input connected to a junction between said second connecting pad and said second output driver, and an output;
    a device for assisting in matching propagation times of signals present on said first and second inputs of said receiver circuit, said device connected between at least one of said first and second inputs and at least one of said first and second output drivers; and
    an assessment circuit for measuring and assessing a phase shift between an applied signal and the time reference signal, said assessment circuit having a first input connected to said output of said receiver circuit, a second input connected to said connection for the time reference signal, and an output for outputting a measured result.

2. The integrated circuit according to claim 1, wherein said receiver circuit has a multiplexer circuit connected to said first and second inputs of said receiver circuit, said multiplexer circuit allowing an enabling of said first and second inputs alternatively to one another.

3. The integrated circuit according to claim 1, wherein said device includes at least one meandering line connected to one of said first and second inputs of said receiver circuit for assisting in matching the propagation times of signals present on said first and second inputs of said receiver circuit.

4. The integrated circuit according to claim 1, further comprising a programmable control circuit having an output for outputting a control signal for controlling a switching time of at least one of the first and second digital signals.

5. The integrated circuit according to claim 4, wherein said programmable control circuit has a control input connected to said output of said assessment circuit for receiving the measured result.

6. The integrated circuit according to claim 4, wherein at least one of said first and second output drivers has an adjustable driver strength controlled by the control signal output by said programmable control circuit.

7. The integrated circuit according to claim 4, further comprising a delay circuit connected to at least one of said first and second output drivers and to said output of said programmable control circuit, at least one of said first and second output drivers has an activation time controlled by said delay circuit and the control signal output from the programmable control circuit.

8. The integrated circuit according to claim 4, wherein said programmable control circuit has one of electrically programmable fuses and laser fuses for adjusting the control signal.

9. The integrated circuit according to claim 1, wherein the integrated circuit is a memory circuit, said first connecting pad outputs the first digital signal being a data signal, and said second connecting pad outputs the second ditigal signal being a data reference signal.

10. The integrated circuit according to claim 1, wherein the integrated circuit contains a memory circuit, said first connecting pad outputs the first digital signal being a data signal, and said second connecting pad outputs a second digital data signal being a data reference signal.

11. A method of operating an integrated circuit, the integrated circuit having a first output driver, a first connecting pad connected to the first output driver and outputting a first digital signal, a second output driver, a second connecting pad connected to the second output driver and outputting a second digital signal, a connection for a time reference signal, a receiver circuit having a first input, a second input, and an output, a device for assisting in matching propagation times of signals present on the first and second inputs of the receiver circuit, and an assessment circuit for measuring and assessing a phase shift between an applied signal and the time reference signal, the method comprises the steps of:
    during a reading process, outputting the first digital signal and the second digital signal each having a rising edge and a falling edge;
    measuring and assessing the phase shift of the rising edge and the falling edge in relation to the time reference signal for the first and second digital signals separately; and
    carrying out an adjustment of at least one of the rising edge and the falling edge of at least one of the first and second digital signals such that the rising edge and the falling edge of the first and second digital signals substantially exhibit no phase shift in relation to each other.

12. The method according to claim 11, which comprises carrying out an adjustment by adjusting an adjustable driver strength of at least one of the first and second output drivers.

13. The method according to claim 11, which comprises making a comparison between a timing of a target value and the rising and falling edges of the first and second digital signals.

14. The method according to claim 13, which comprises adjusting the timing of the rising and falling edges to the target value by controlling an enable time of at least one of the first and second output drivers.

15. The method according to claim 11, which comprises during one of a start and normal operation of the integrated circuit, reading out the first and second digital signals and coordinating times of the rising and falling edges with each other.

* * * * *